United States Patent [19]
Anderson et al.

[11] Patent Number: 5,130,989
[45] Date of Patent: Jul. 14, 1992

[54] SERIAL AND PARALLEL SCAN TECHNIQUE FOR IMPROVED TESTING OF SYSTOLIC ARRAYS

[75] Inventors: Daryl E. Anderson, Corvallis, Oreg.; Ralph H. Lanham, Cupertino, Calif.; Neal C. Jaarsma, Corvallis, Oreg.

[73] Assignee: Hewlett-Packard Company, Palo Alto, Calif.

[21] Appl. No.: 494,016

[22] Filed: Mar. 15, 1990

[51] Int. Cl.⁵ .................................. G01R 31/28
[52] U.S. Cl. ........................... 371/22.3; 371/68.3
[58] Field of Search ......................... 371/22.3, 68.3

[56] References Cited

U.S. PATENT DOCUMENTS

| | | | |
|---|---|---|---|
| 4,513,418 | 4/1985 | Bardell, Jr. et al. | 371/22.3 |
| 4,698,588 | 10/1987 | Hwang et al. | 371/22.3 X |
| 4,996,691 | 2/1991 | Wilcox et al. | 371/22.3 X |

OTHER PUBLICATIONS

Eichelberger, E. et al., "A Logic Design Structure for LSI Testability", *Proceedings, 14th Design Automation Conference*, 1977, pp. 462–468.

Primary Examiner—Stephen M. Baker

[57] ABSTRACT

A method for testing a systolic array in which a plurality of sequential registers is each connected to the rest by an intervening logic component. Each register includes a plurality of memory elements. Each register can be enabled to act as a latch register whereby digital data is loaded into an output therefrom in parallel or as a shift register whereby digital data is shifted sequentially in each register from one memory element to the next adjacent memory element. A test vector consisting of a preselected string of digital data is shifted in parallel into each of the registers. The test vector in each register is loaded into the associated logic component which operates on the vector and stores the data in the next adjacent register. The resulting data is serially clocked from each register onto unique bus nodes and examined in parallel to determine whether or not the expected result was obtained.

1 Claim, 1 Drawing Sheet

SERIAL AND PARALLEL SCAN TECHNIQUE FOR IMPROVED TESTING OF SYSTOLIC ARRAYS

BACKGROUND OF THE INVENTION

1. Field of the Invention

The present invention relates to methods and apparatus for testing circuits incorporating memory arrays and more particularly to such methods and apparatus in which a test vector comprising a preselected string of digital data is loaded into the array and resulting strings are read out.

2. Description of the Related Art

Many circuits incorporate an array of memory registers which function as latches for temporarily storing data before and/or after logic operations are formed on the stored data. One such circuit is known as a systolic array. Such a circuit includes a plurality of sequential segments each of which includes a register and an associated logic circuit. Each logic circuit includes a related memory.

The systolic array is used to compare long strings of digital data. In operation, a first string of digital data is "pumped" through the circuit by progressively transferring the string, section by section, from the first register, to the second and so forth. The first section of the string is loaded in parallel to the first register and thereafter, in sequence with conventional clocking circuitry, additional sections are loaded and advanced through each segment of the array. The first string of data is stored, in separate sections, in the memories associated with each logic circuit.

After the first data string is so stored, a second string is similarly "pumped" through the array. The logic circuitry in each segment performs logic operations on each section of data in the second string as it passes from segment to segment. The data output from the last segment in the array provides an indication of the similarity of the first and second strings of data.

In parallel testing of such an array, test vectors are applied to the device's input while the device performs as described above. The device's output is observed for correct behavior. Such testing suffers disadvantages relating to observability and controllability. In other words, it is difficult first, to control a logic circuit intermediate the first and last segments of the array and second, even if such control is exercised, it is difficult to observe the resultant data produced by such a logic circuit to see whether or not it performed as expected on the test vector.

One approach to overcoming the drawbacks associated with controllability and observability of testing as described above comprises designing the circuit so that each of the registers therein can be connected to form a single long shift register. Thereafter, a test vector having a length equal to the total number of memory elements in all of the registers is shifted sequentially through the shift register so formed. After the test vector is so loaded into the registers, each register is again converted to its normal latching operation. The array is then cycled to advance the data in each register through the logic circuit associated therewith and into the next register in the array. Thereafter the registers are again configured to form a single shift register and the data therein is sequentially shifted from the circuit. The resultant data is then examined, section by section, to determine whether or not each segment in the array performed as expected. The foregoing procedure is sometimes referred to in the art as serial scan testing.

When arrays have either a large number of segments or when the register in each segment includes a large number of memory elements, or both, problems arise in connection with serial scan testing. For example, in a systolic array there may be 16 segments, each having 150 memory elements. Serial scan testing such an array requires a test vector having 2400 (16 × 150) bits therein. Such a test vector exceeds the capacity of some testing equipment, makes debugging the circuit very difficult and makes generation of the test vector extremely complex.

SUMMARY OF THE INVENTION

In one aspect, the present invention comprises a circuit having an array of sequential memory registers. Each of the registers includes a parallel input and output and a serial input and output. Means are provided for enabling each register to receive data from the serial input thereof and for enabling each register to receive data from the parallel input thereof and output data on the parallel output thereof. Input means are connected in parallel to each of the registers for simultaneously shifting a test vector comprising a preselected string of digital data into the registers when the same are enabled to receive data from the serial input thereof.

The present invention is also implemented in a method for testing a circuit which incorporates a plurality of registers.

It is a general object of the present invention to provide a serial and parallel scan technique for improved testing of arrays which overcomes the above enumerated disadvantages associated with prior art techniques.

It is a more specific object of the present invention to provide such a technique having good controllability and observability of all nodes in the array.

It is another specific object of the present invention to provide such a technique which can be tested with a smaller vector and in less time than required by prior art techniques.

It is yet another more specific object of the present invention to provide such technique which can be implemented by means of a self-test.

The foregoing and other objects, features and advantages of the invention will become more readily apparent from the following detailed description of a preferred embodiment which proceeds with reference to the drawings.

DETAILED DESCRIPTION OF THE PREFERRED EMBODIMENT

Figure 1:
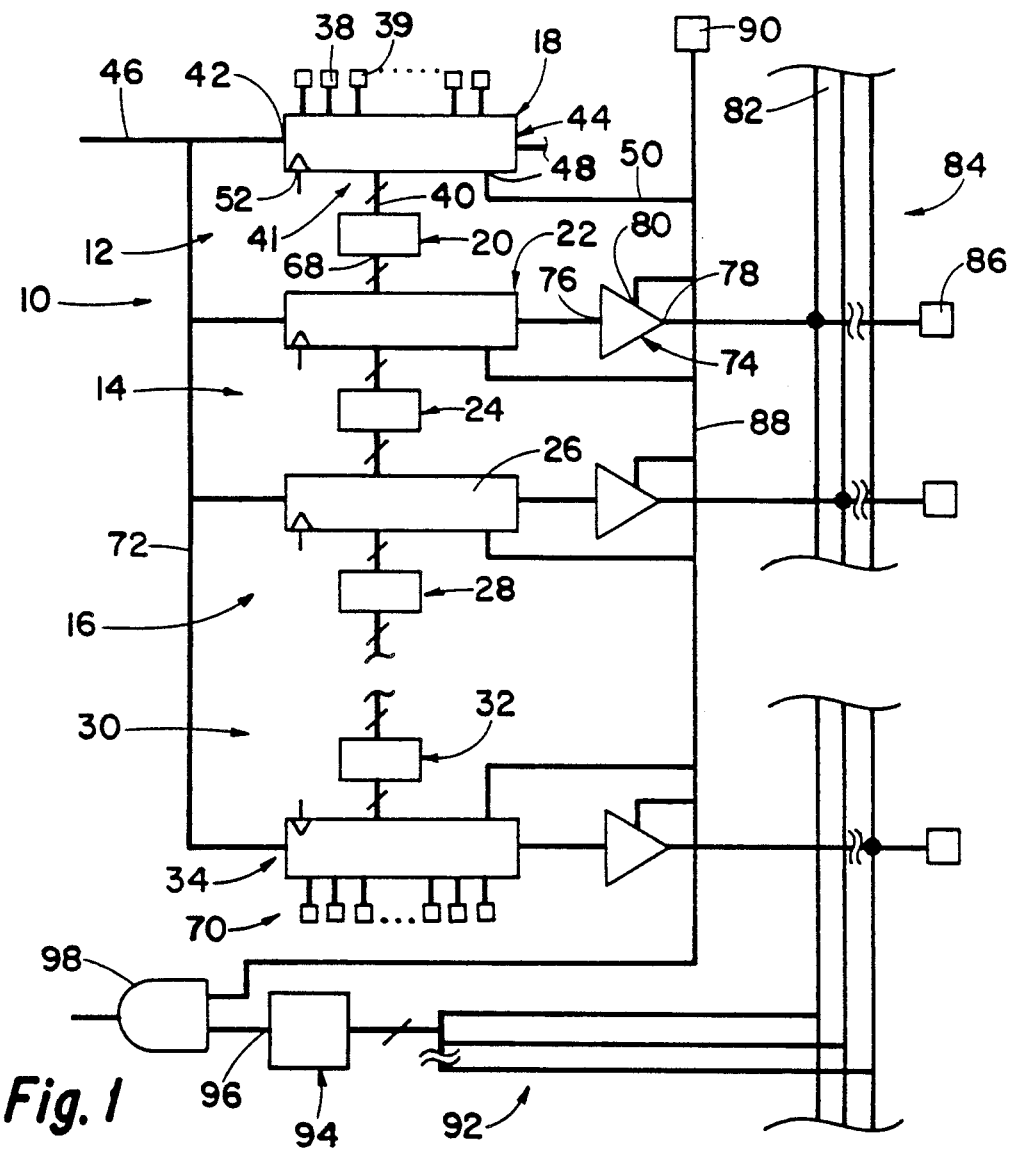
FIG. 1 is a schematic diagram of a circuit constructed in accordance with the present invention.

Indicated generally at 10 is a circuit constructed in accordance with the present invention. Circuit 10 is sometimes referred to as a systolic array. In the present embodiment of the invention, circuit 10 is implemented on an integrated circuit chip.

Circuit 10 includes a plurality of array segments, three of which are indicated generally at 12, 14, 16. Each array segment includes therein a register, like register 18 in segment 12, and an associated logic component, like logic component 20 in segment 12. Logic component 20, and each of the other logic components in circuit 10, is referred to herein as transforming means. The logic components are conventional in structure and operation and each includes an associated memory (not shown separately from the logic components in the drawing). Such associated memories are tested in a conventional manner. Similarly, segment 14 includes a register 22 and a logic component 24 and segment 16 includes a register 26 and a logic component 28. A portion of the last segment in circuit 10 is indicated generally at 30. Segment 30 includes therein a register (not shown) and a logic component 32. An array termination register 34 is substantially identical to each of the other registers, like registers 18, 22, 26, in circuit 10.

Considering now the structure and operation of register 18, a plurality of pads, two of which are pads 38, 39, are connected via conductors as shown to parallel input terminals of register 18. A plurality of parallel output terminals, indicated generally at 41, are connected to a bus 40. Bus 40 includes a plurality of conductors upon which parallel outputs from register 18 are simultaneously placed as will be hereinafter described in more detail.

Register 18 also includes a serial input terminal 42 and a serial output terminal 44. Serial input terminal 42 is connected to a conductor 46 while output terminal 44 is not connected to other components in circuit 10. As will later be hereinafter more fully explained, the serial output terminals of the other registers in circuit 10 are connected to other circuit components.

Figure 2:
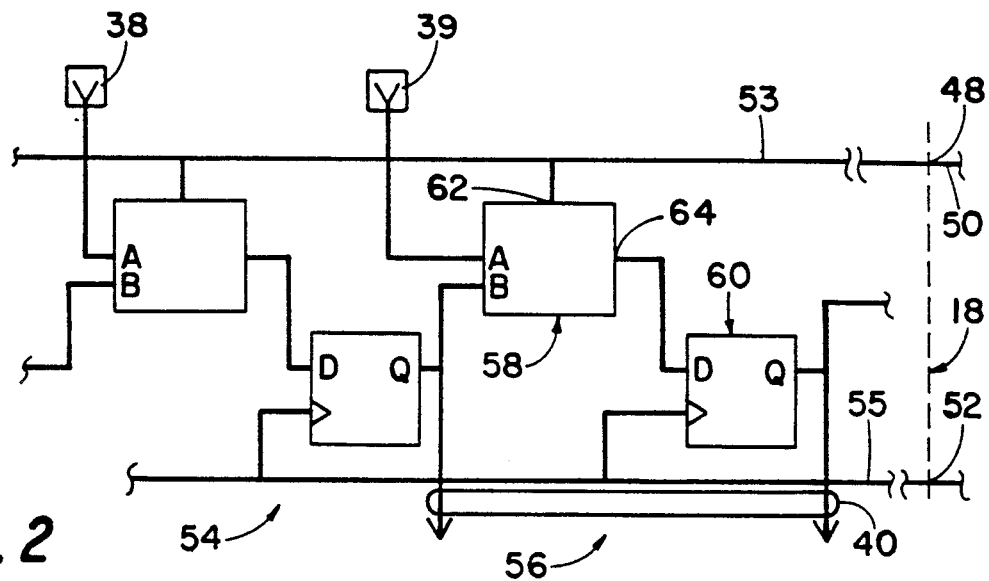
FIG. 2 is an enlarged schematic of a portion of one of the registers shown in FIG. 1.

A scan enable terminal 48 on register 18 is connected to a conductor 50. Register 18 includes a clock terminal 52 which is connected via a conductor to a conventional oscillator (not shown) for providing a timing signal to register 18. Attention is directed to FIG. 2 for a description of the internal structure of register 18.

The structure previously identified in FIG. 1 retains the same numeral in FIG. 2. Scan enable terminal 48 is connected to internal conductor 53 and clock terminal 52 is connected to internal conductor 55. Included in register 18 are a plurality of memory elements, two of which are indicated generally at 54, 56. Memory element 56 includes therein a multiplexer 58 and a flip-flop 60.

Multiplexer 58 includes a select terminal 62, input terminals A, B, and an output terminal 64. Terminal A is connected to pad 39. In operation, multiplexer 58 selects terminal A or terminal B and applies the signal appearing thereon to output terminal 64. Such selection is dependent upon the signal applied to select terminal 62. When the terminal on 62 is at a high level, the signal on terminal B is applied to output terminal 64. When the signal on terminal 62 is at a low level, the signal on terminal A is applied to output terminal 64.

Flip-flop 60 includes an input terminal D, an output terminal Q and a clock terminal which is connected to terminal 52 on register 18 via conductor 55. Flip-flop 60 is conventional in structure and operation. Each time a transition from "0" to "1" appears on conductor 55, the value on terminal D ("1" or "0") is applied to terminal Q and is held until the next such transistion.

Input terminal D of flip-flop 60 is connected via a conductor to output terminal 64 of multiplexer 58. Output terminal Q is applied to terminal B of the multiplexer (not shown) in the next adjacent memory element in register 18 in the same fashion that output terminal Q of the flip-flop in memory element 54 is connected to terminal B of multiplexer 58. Similarly, the conductor applied to terminal B of the multiplexer in memory element 54 is connected to an output terminal Q of a flip-flop (not shown) in the preceding memory element adjacent element 54. Output terminals Q are also applied to corresponding parallel output terminals 41 which in turn are connected to separate conductors in bus 40.

The parallel input terminals of register 18, which are each connected to pads, like pads 38, 39, are connected internally of register 16 to an associated terminal A on a multiplexer, like multiplexer 58.

Each of the other registers, like registers 22, 26, 34, in circuit 10 are constructed and operate in substantially the same manner as previously described in connection with register 18. Each register includes parallel input and output terminals, serial input and output terminals, a clock terminal and a scan enable terminal. The terminals on each of the other registers are positioned the same as the corresponding terminals identified on register 18.

With reference to FIG. 1, the conductors in bus 40 are applied to the input terminals of logic component 20. While the output terminals of logic component 20 are connected to a bus 68 which in turn is applied to the parallel input terminals of register 22. Each of the other array segments, like segments 14, 16, include a bus which connects the parallel output terminals of the register therein to the input terminals of the associated logic component. Similarly, each logic component in each array segment includes a bus, like bus 68, which connects the output terminals of the logic component with the input terminals of the register in the next array segment, like bus 68 is connected to the input terminals of register 22. At the lower end of the array, a bus connects logic component 32 in segment 30 with the input terminals of register 34. The parallel output terminals of register 34 are connected to a plurality of pads, indicated generally at 70.

A conductor 72 is connected to conductor 46 and to each of the other serial input terminals of each of the registers in circuit 10. Conductors 46, 72 make up a part of what is referred to herein as input means.

A tri-state buffer 74, adjacent register 22, includes an input terminal 76, an output terminal 78 and a scan enable terminal 80. Buffer 74 is of conventional design. When the signal on scan enable terminal 80 is held at a high or "1" voltage, buffer 74 passes "1" (high voltage) and "0" (low voltage) signals appearing on terminal 76 to terminal 78. When the voltage on terminal 80 is low, the impedance of buffer 74 as measured at terminal 78 rises to a very high level so as to in effect be an open circuit isolating terminal 78 from terminal 76. When the voltage on scan enable terminal 80 is low, the buffer is referred to herein as being in a first state and when the voltage on terminal 80 is high, the buffer is in a second state.

Input terminal 76 is connected to the serial output terminal of register 22 while output terminal 78 is connected to a conductor 82 which is one of a plurality of conductors in a bus indicated generally at 84. Output terminal 78 is also connected to a pad 86. Scan enable terminal 80 is connected to a conductor 88 which in turn is connected to a scan enable pad 90.

Each array segment between segments 14 and 30 is associated with a buffer which is constructed and operates in the same manner as buffer 74 and which is connected to the serial output of its associated register and to scan enable pad 90 as described in connection with buffer 74. Each of the scan enable terminals on the registers and tri-state buffers in circuit 10 are electrically connected to pad 90. Each of the output terminals of the tri-state buffers is connected to a different conductor in bus 84 and to pads which are shown on the right of bus 84, like pad 86.

A bus, indicated generally at 92 includes a plurality of conductors each of which is connected to a different conductor in bus 84. Each of the conductors in bus 92 is applied to a different input terminal of a logic gate 94. Gate 94 produces a "1" or high voltage on an output terminal 96 unless the values on the input terminals of gate 94 equal one another. In other words, for all low voltage or "0" values on the input terminal of gate 94, a low voltage or "0" value appears on terminal 96. For all high voltage or "1" values on the input terminals of gate 94, a "0" also appears on output terminal 96. If, on the other hand, there is a mixture of high and low values, in any combination, on the input terminals of gate 94, output terminal 96 goes to a high voltage or "1" level.

Output terminal 96 is connected to one of the input terminals of an and gate 98. When both of the input terminals for and gate 98 are at high voltage level, the output terminal thereof also goes to a high level. Gates 94, 98 and bus 92 are referred to herein as examining means.

The systolic array embodied in circuit 10 is used to compare long strings of digital data as previously described herein. As part of the manufacturing process, circuit 10 is tested to insure that all of the components are operating properly. First, a test vector comprising a preselected string of digital data is generated. Methods for generating such test vectors are known. Those skilled in the art can generate vectors which are suitable for a specific circuit and which may be applied thereto by a conventional integrated circuit tester. For circuit 10, a test vector having a total number of bits equal to the total number of memory elements, like memory elements 54, 56, in any single register is required. The test vector is stored in the tester which is connected to circuit 10 via conductor 46, pad 90 and the buffer output pads, like pad 86, in a manner known to those having ordinary skill in the art. The clock signal in circuit 10 is also supplied to the tester. The tester (not shown) comprises a portion of what is referred to herein as input means.

To initiate testing, the tester applies a high voltage level or scan enable signal to pad 90. So doing applies a signal to each of the scan enable terminal on the registers, like terminal 48 on register 18. The scan enable signal is also applied to each of the scan enable terminals on each of the tri-state buffers, like terminal 80 on buffer 74. The signal thus causes each of the multiplexers, like multiplexer 62, in each of the registers to apply signals on input terminal B thereof to the multiplexer output terminal, like output terminal 64. So doing places each of the registers into what is referred to herein as a second state and causes each register to function as a shift register.

After the scan enable signal is so applied to pad 90, the tester clocks the test vector into each of the registers via conductor 46. With each clock pulse, the bits which comprise the test vector are shifted into the next adjacent memory element in each register. After the clock pulses a sufficient number of times so that the test vector is loaded into each register, with each memory element storing a bit of the test vector, the scan enable signal is held low (by the tester) at pad 90. So doing places the register into what is referred to herein as a first state and enables the register to act as a latch register whereby digital data is loaded into the parallel input terminals and output from the parallel output terminals of each register.

With the test vector loaded into each register, and with the scan enable signal removed from pad 90, circuit 10 is pulsed or clocked through a single cycle of normal operation. Thus, in each array segment the test vector is transferred from the register to the logic component, like the vector in register 18 is transferred to logic component 20. Logic component 20 operates on the test vector in the same manner that it operates on any other data loaded thereinto from register 18. In other words, it performs the same operations performed on the long strings of data, a section at a time, when circuit 10 is performing its intended function. Thereafter the data from logic circuit 20, such being referred to herein as test vector data, is transferred, via bus 68 and the parallel input terminals of register 22, into register 22, the register in the next segment.

Similarly, in segment 14, the test vector in register 22 is operated on by logic component 24 and the resulting test vector data loaded into register 26 and so forth through segment 30. The test vector data produced by logic component 32 is loaded into termination register 34.

After circuit 10 is so cycled, the tester applies the scan enable signal to pad 90 thereby causing each of the registers to again act as shift registers. The test vector data in each of the registers downstream from array segment 12 is then clocked from each register via the associated tri-state buffer, like buffer 74, onto a different conductor in bus 84 and onto the pads, like pad 86, which are connected to the tester.

The signals are also applied to bus 92 and thus to the input of gate 94. In circuit 10, each of the array segments are identical to one another. The test vector data produced after the test vector in each register is cycled to the next segment should therefore all be identical. As the test vector data from each register is sequentially applied to a different conductor in bus 92, output terminal 96 of gate 94 remains in a low voltage state for so long as each of the inputs are all the same, i.e., all high or all low.

Assume for the moment that a component malfunction in segment 14 causes one of the bits in the resulting test vector data clocked into register 26 to be low when it should be high. When that particular bit position is clocked from each of the registers, the output of gate 94 rises to a high level. Since the scan enable signal on pad 90 is applied to the other input of and gate 98, the output thereof goes to a high level to indicate an error. The previously-mentioned tester also monitors the signals appearing on the pads, like pad 86, and analyzes the same in a conventional manner.

In a slightly modified embodiment of the invention, the test vector used in the tester for post-production testing is stored in a programmable read only memory (PROM) which is fabricated on the same chip as circuit 10. Thereafter, a processor, also fabricated in the circuit, can be programmed to produce an enable signal, which is applied to pad 90, and clock the test vector from the PROM in the same manner as described in connection with the tester. The output of gate 98 is utilized to generate a signal which indicates an error condition. Thus, circuit 10 can perform a self-test as described above each time power is applied thereto.

Having illustrated and described the principles of my invention in a preferred embodiment thereof, it should be readily apparent to those skilled in the art that the invention can be modified in arrangement and detail without departing from such principles. I claim all modifications coming within the spirit and scope of the accompanying claims.

We claim:

1. A method for testing a circuit which incorporates a plurality of registers, each of which includes a plurality of memory elements, of the type which in a first state act as sequential latch registers whereby digital data is loaded into and output therefrom in parallel and in a second state act as shift registers whereby digital data is shifted sequentially in each register from one memory element to the next adjacent memory element, said method comprising the steps of:

switching the registers from said first state to said second state;

simultaneously shifting a test vector comprising a preselected string of digital data into each of the selected registers;

switching the registers from said second state to said first state;

causing the data in each of the registers to be output therefrom;

causing a different logic component associated with each register to perform the same operation on the data from its associated register;

storing the data resulting from said logical operation in the next register in sequence;

switching the registers from said first state to said second state;

simultaneously shifting the data from each of the registers to a serial output thereof;

applying each serial output to a different line in a bus thereby generating an identical logic state on each line in said bus as the data appears on each serial output when the circuit is functioning properly;

examining the bus to determine whether or not each line in the bus has an identical logic state; and isolating each serial output from the bus.

* * * * *